US008736158B1

(12) United States Patent
Oh et al.

(10) Patent No.: US 8,736,158 B1
(45) Date of Patent: May 27, 2014

(54) ORGANIC ELECTROLUMINESCENT DISPLAY DEVICE AND METHOD OF FABRICATING THE SAME

(71) Applicant: LG Display Co., Ltd., Seoul (KR)

(72) Inventors: Kyung-Tak Oh, Gum-si (KR); Byoung-June Lee, Gimcheon-si (KR); Mi-Youn Yang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/157,224

(22) Filed: Jan. 16, 2014

Related U.S. Application Data

(62) Division of application No. 12/654,605, filed on Dec. 24, 2009, now Pat. No. 8,651,910.

(30) Foreign Application Priority Data

Jun. 9, 2009 (KR) .................. 10-2009-0050821

(51) Int. Cl.
*H01J 1/62* (2006.01)
(52) U.S. Cl.
USPC .......................................... 313/504; 313/512
(58) Field of Classification Search
USPC ................................ 313/498, 504, 506, 512
See application file for complete search history.

(56) References Cited

U.S. PATENT DOCUMENTS

2004/0217695 A1  11/2004  Yoneda et al.

FOREIGN PATENT DOCUMENTS

| JP | 200471554 A | 3/2004 |
|---|---|---|
| JP | 2004165067 A | 6/2004 |
| JP | 2005322564 A | 11/2005 |
| JP | 200970859 A | 4/2009 |

*Primary Examiner* — Joseph L Williams
(74) *Attorney, Agent, or Firm* — McKenna Long & Aldridge, LLP

(57) ABSTRACT

A top emission type organic electroluminescent display device includes a first substrate including a pixel region, a switching thin film transistor and a driving thin film transistor in the pixel region on the first substrate, a passivation layer covering the switching thin film transistor and the driving thin film transistor and exposing a drain electrode of the driving thin film transistor, a first electrode on the passivation layer and connected to the drain electrode of the driving thin film transistor, a buffer pattern in a border of the pixel region and overlapping an edge of the first electrode, a first spacer on the buffer pattern along a first direction, the first spacer having a first thickness and a dam shape, a second spacer on the buffer pattern along a second direction, the second spacer having a second thickness and a dam shape, a third spacer on the buffer pattern at a crossing portion of the first and second spacers, the third spacer having a third thickness and a columnar shape, wherein the third thickness is thicker than the first thickness or the second thickness, an organic emission layer on the first electrode between adjacent buffer patterns, a second electrode on the organic emission layer and the first, second and third spacers, a second substrate facing the first substrate, and a seal pattern between peripheries of the first and second substrates.

8 Claims, 16 Drawing Sheets

ORGANIC ELECTROLUMINESCENT DISPLAY DEVICE AND METHOD OF FABRICATING THE SAME

This application is a Divisional of U.S. application Ser. No. 12/654,605, filed on Dec. 24, 2009, which claims the benefit of Korean Patent Application No. 10-2009-00050821, filed in Korea on Jun. 9, 2009, all of which are incorporated herein by reference in their entirety.

BACKGROUND OF THE INVENTION

1. Field of the Invention

The present invention relates to an organic electroluminescent display device, and more particularly, to an organic electroluminescent display device and a method of fabricating the same.

2. Discussion of the Related Art

Among flat panel displays, organic electroluminescent displays have properties of high brightness and low driving voltages. In addition, because they are self-luminous, the organic electroluminescent displays have excellent contrast ratios and ultra thin thicknesses. The organic electroluminescent displays have response time of several micro seconds, and there are advantages in displaying moving images. The organic electroluminescent displays have wide viewing angles and are stable under low temperatures. Since the organic electroluminescent displays are driven by low voltage of direct current (DC) 5V to 15V, it is easy to design and manufacture driving circuits. A manufacturing process of an organic electroluminescent display is very simple because only deposition and encapsulation steps are required.

The organic electroluminescent displays are classified into a passive matrix type and an active matrix type. In the passive matrix type, scan lines and signal lines cross each other to form diodes, and the signal lines are sequentially scanned to drive pixels. To obtain required average brightness, instant brightness is needed which is the product of average brightness and the number of lines.

On the other hand, in the active matrix type, a thin film transistor, as a switching element, is formed in each sub-pixel. A first electrode connected to the thin film transistor turns on/off by the sub-pixel, and a second electrode facing the first electrode functions as a common electrode. In addition, a voltage applied to the sub-pixel is stored in a storage capacitor, and the voltage is maintained until the signal of next frame is applied. Accordingly, regardless of the number of the scan lines, the sub-pixels are continuously driven during one frame. Even though low currents are applied, uniform brightness may be obtained. Therefore, recently, the active matrix type organic electroluminescent displays have been widely used because of their low power consumption, high definition and large-sized possibility.

FIG. 1 is an equivalent circuit diagram illustrating a pixel of an active matrix organic electroluminescent display device according to the related art.

In FIG. 1, the pixel of the active matrix organic electroluminescent display device includes a switching thin film transistor STr, a driving thin film transistor DTr, a storage capacitor StgC, and an organic electroluminescent diode E.

More particularly, a gate line GL is formed along a first direction. A data line DL is formed along a second direction crossing the first direction. The gate line GL and the data line DL define a pixel region P. A power line PL for supplying a source voltage is spaced apart from the data line DL.

The switching thin film transistor STr is formed at a crossing portion of the gate line GL and the data line DL. The driving thin film transistor DTr is electrically connected to the switching thin film transistor STr. The organic electroluminescent diode E includes a first electrode connected to a drain electrode of the driving thin film transistor DTr and a second electrode connected to the power line PL. The power line PL supplies the source voltage to the organic electroluminescent diode E. The storage capacitor StgC is formed between a gate electrode and a source electrode of the driving thin film transistor DTr.

A scan signal is applied to the switching thin film transistor STr through the gate line GL, and the switching thin film transistor STr turns on. Then, a data signal from the data line DL is supplied to the gate electrode of the driving thin film transistor DTr, and the driving thin film transistor DTr turns on. Accordingly, the organic electroluminescent emits light. Here, when the driving thin film transistor DTr is in on-state, levels of currents flowing in the organic electroluminescent diode E from the power line PL are determined. The organic electroluminescent diode E produces gray scales according to the levels of the currents. When the switching thin film transistor STr turns off, the storage capacitor StgC maintains a gate voltage of the driving thin film transistor DTr constant. Even though the switching thin film transistor STr is in off-state, the levels of the currents flowing in the organic electroluminescent diode D are constantly maintained until a next frame.

The organic electroluminescent display device is classified into a top emission type and a bottom emission type according to a direction of light emitted from the organic electroluminescent diode. The bottom emission type has a disadvantage of low aperture ratio, and recently the top emission type has been widely used.

FIG. 2 is a schematic plan view of a top emission type organic electroluminescent display device according to the related art, and FIG. 3 is a cross-sectional view taken along the line III-III in FIG. 2.

In FIGS. 2 and 3, the related art top emission type organic electroluminescent display device includes first and second substrates 10 and 70, which are disposed to face each other. Peripheries of the first and second substrates 10 and 70 are sealed by a seal pattern 80. A driving thin film transistor DTr is formed in each pixel region P on the first substrate 10. A passivation layer 40 is formed on the driving thin film transistor DTr and has a drain contact hole 43. A first electrode 47 is formed on the passivation layer 40 and contacts an electrode (not shown) of the driving thin film transistor DTr through the drain contact hole 43.

An organic emission layer 55 is formed on the first electrode 47. The organic emission layer 55 includes red, green and blue luminous patterns 55a, 55b and 55c each corresponding to the pixel region P. A second electrode 58 is formed on the organic emission layer 55 all over the surface of the first substrate 10. The first and second electrodes 47 and 58 provide electrons and holes.

The first substrate 10 and the second substrate 70 are attached by the seal pattern 80, and the second electrode 58 on the first substrate 10 is spaced apart from the second substrate 70.

In the related art top emission type organic electroluminescent display device 1, a buffer pattern 50 is formed in a border area of the pixel region P. The buffer pattern 50 overlaps edges of the first electrode 47. A spacer 51 having a dam shape is formed on the buffer pattern 50 and along a direction of the gate line (not shown), that is, a sequential and alternate arrangement direction of the red, green and blue luminous patterns 55a, 55b and 55c. The spacer 51 supports a shadow mask (not shown), which is used to form the organic emission layer 55.

FIGS. 4A and 4B are plan views of showing a step for forming an organic emission layer using a shadow mask in processes of manufacturing a related art top emission type organic electroluminescent display device. FIG. 5A is a cross-sectional view taken along the line VA-VA of FIG. 4A, and FIG. 5B is a cross-sectional view taken along the line VB-VB of FIG. 4B. FIG. 6 is a cross-sectional view taken along the line IV-IV of FIG. 4B.

An organic emission layer 55 is formed on a first substrate 10 using a shadow mask 90, which includes openings OA corresponding to the pixel regions P and blocking portions BA corresponding to other regions excluding the pixel regions P.

First, the shadow mask 90 is disposed over the substrate 10, on which the organic emission layer 55 will be formed. The shadow mask 90 is aligned such that the opening OA of the shadow mask 90 corresponds to an area for forming the organic emission layer 55 in the pixel region P on the substrate 10. At this time, the shadow mask 90 is located very close to the substrate 10. Since the shadow mask 90 is made of a metallic material, protrusions (not shown) may be formed at a surface of the shadow mask 90 or particles may be attached to the surface of the shadow mask 90. The protrusions or particles may have a size of 1 micrometer to 6 micrometers.

Accordingly, when the shadow mask 90 having the protrusions or particles is aligned with the substrate 10, the protrusions or particles may contact the first electrode 47 in the pixel region P, and problems such as scratches or pits may be caused.

The shadow mask 90 is formed of a metallic material, and the shadow mask 90 for fabricating an organic electroluminescent display device, which has a large size, hangs down. Particularly, even though the shadow mask 90 is supported by the spacer 51, the shadow mask 90 hangs down in the pixel region P between adjacent spacers 51. The spacer 51 has a thickness of 2.5 micrometers to 3 micrometers. A total thickness of the buffer pattern 50 and the spacer 51, that is, a distance between a top surface of the spacer 51 and a surface of the first electrode 47 is about 6 micrometers, and the shadow mask 90 hangs down by 1 micrometer to 2 micrometers. Accordingly, when the shadow mask 90 is disposed over the substrate 10 and is aligned with the substrate 10, the scratches or pits are caused by the particles or protrusions.

To prevent the problem, the shadow mask 90 may be aligned not to contact the substrate 10, and in this case, the shadow mask 90 may be as close to the substrate 10 as possible to accurately align the shadow mask 90 and the substrate 10. A distance between the shadow mask 90 and the substrate may be 1 micrometer to 2 micrometers. However, in this case, since the shadow mask 90 is not supported by anything, the shadow mask 90 hangs down more than when the shadow mask 90 is supported by the spacer 51, and the scratches or pits are caused on the surface of the first electrode 47 in the pixel region P, where the organic emission layer 55 is formed, due to the particles or protrusions. The scratches or pits are shown as dark points in a displayed image to thereby lower display qualities.

To solve the problem, a plan of increasing the thickness of the spacer 51 has been suggested. However, the spacer 51 may be formed on a substantially entire surface of the substrate by applying a transparent organic insulating material by a spin-coating method and patterning it. To uniformly apply the organic insulating material on the substantially entire surface of the substrate, viscosity of the organic insulating material is important. If the viscosity of the organic insulating material is raised to increase the thickness of the spacer 51, spraying properties of the organic insulating material is lowered, and there is difference between thicknesses of the applied organic insulating material in central and peripheral portions of the substrate. Therefore, the spacer 51 has a maximum thickness of about 3 micrometers such that the spacer 51 has a uniform thickness all over the substrate. Additionally, when the spacer 51 has a thickness more than 3 micrometers, there are shadow problems due to the spacer 51, and step distance problems or incorrect color problems may be caused.

SUMMARY OF THE INVENTION

Accordingly, the present invention is directed to a top emission type organic electroluminescent display device and a method of fabricating the same that substantially obviates one or more of the problems due to limitations and disadvantages of the related art.

An object of the present invention is to provide a top emission type organic electroluminescent display device and a method of fabricating the same that prevent problems due to a shadow mask when an organic emission layer is formed.

Another object of the present invention is to provide a top emission type organic electroluminescent display device and a method of fabricating the same that improve display qualities and increase productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a top emission type organic electroluminescent display device includes a first substrate including a pixel region, a switching thin film transistor and a driving thin film transistor in the pixel region on the first substrate, a passivation layer covering the switching thin film transistor and the driving thin film transistor and exposing a drain electrode of the driving thin film transistor, a first electrode on the passivation layer and connected to the drain electrode of the driving thin film transistor, a buffer pattern in a border of the pixel region and overlapping an edge of the first electrode, a first spacer on the buffer pattern along a first direction, the first spacer having a first thickness and a dam shape, a second spacer on the buffer pattern along a second direction, the second spacer having a second thickness and a dam shape, a third spacer on the buffer pattern at a crossing portion of the first and second spacers, the third spacer having a third thickness and a columnar shape, wherein the third thickness is thicker than the first thickness or the second thickness, an organic emission layer on the first electrode between adjacent buffer patterns, a second electrode on the organic emission layer and the first, second and third spacers, a second substrate facing the first substrate, and a seal pattern between peripheries of the first and second substrates.

In another aspect, a method of fabricating a top emission type organic electroluminescent display device includes forming a switching thin film transistor and a driving thin film transistor in a pixel region on a first substrate, forming a passivation layer over the switching thin film transistor and the driving thin film transistor, the passivation layer having a drain contact hole exposing a drain electrode of the driving thin film transistor, forming a first electrode on the passivation layer and connected to the drain electrode of the driving thin film transistor, forming a buffer pattern in a border of the pixel region and overlapping an edge of the first electrode, forming a first spacer on the buffer pattern along a first direction, the first spacer having a first thickness and a dam shape, forming a second spacer on the buffer pattern along a second direction, the second spacer having a second thickness and a dam shape, forming a third spacer on the buffer pattern at a crossing portion of the first and second spacers, the third spacer having a third thickness and a columnar shape, wherein the third thickness is thicker than the first thickness or the second thickness, forming an organic emission layer on the first electrode between adjacent buffer patterns, forming a second electrode on the organic emission layer and the first, second and third spacers, and disposing a transparent second substrate over the first substrate and attaching the first substrate and the second substrate such that a seal pattern is formed between the first and second substrates along peripheries of the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated an embodiment of the present invention, which is illustrated in the accompanying drawings.

Figure 1:
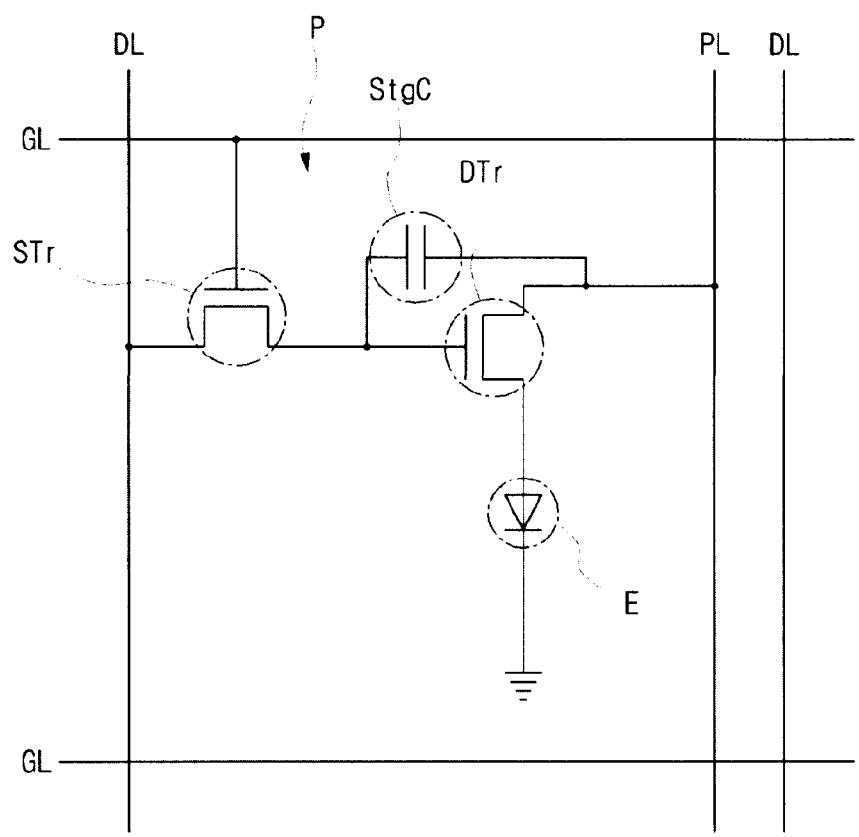
FIG. 1 is an equivalent circuit diagram illustrating a pixel of an active matrix organic electroluminescent display device according to the related art.
Figure 2:
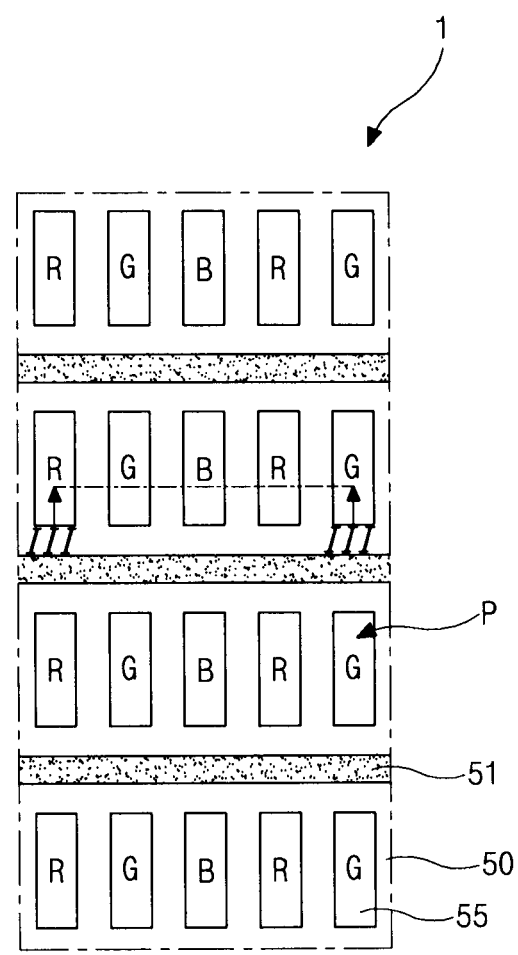
FIG. 2 is a schematic plan view of a top emission type organic electroluminescent display device according to the related art.
Figure 3:
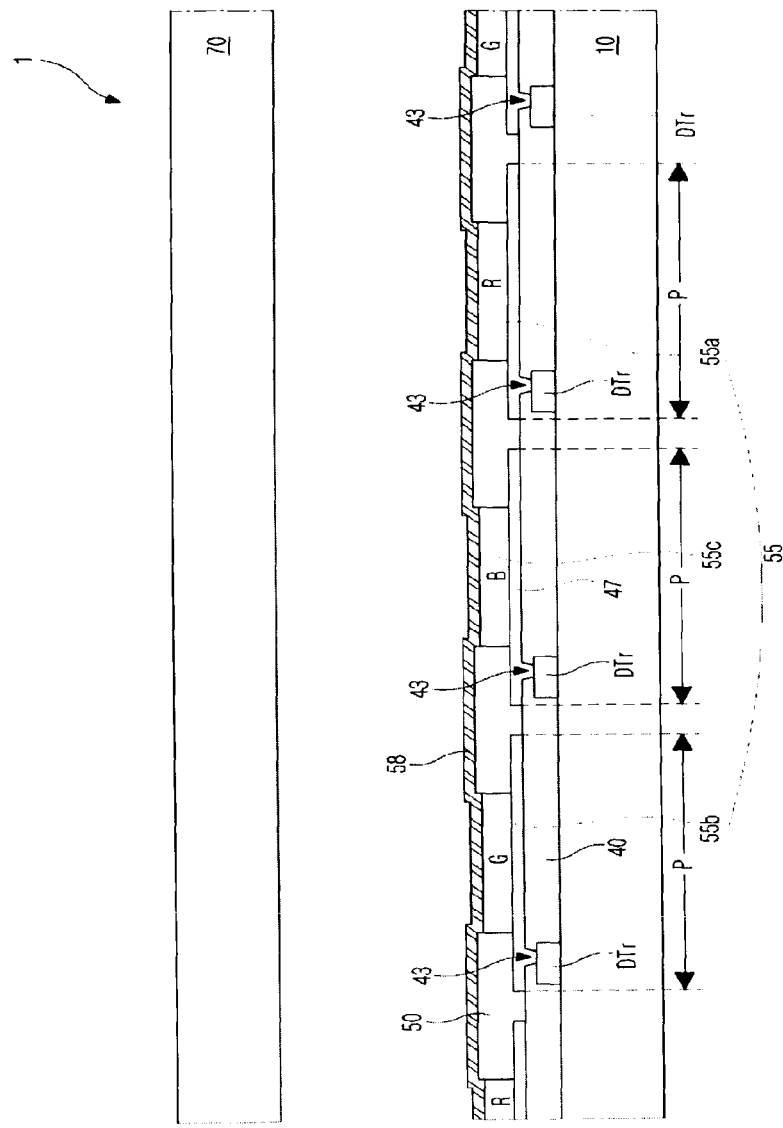
FIG. 3 is a cross-sectional view taken along the line III-III in FIG. 2.
Figure 4A:
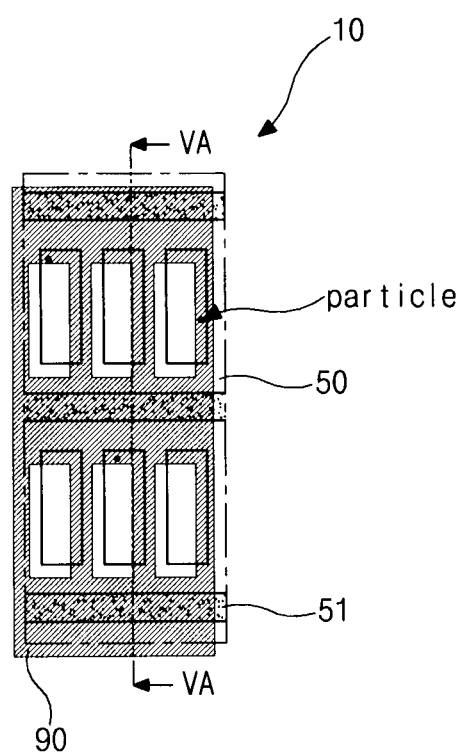
FIGS. 4A and 4B are plan views of showing a step for forming an organic emission layer using a shadow mask in processes of manufacturing a related art top emission type organic electroluminescent display device.
Figure 4B:
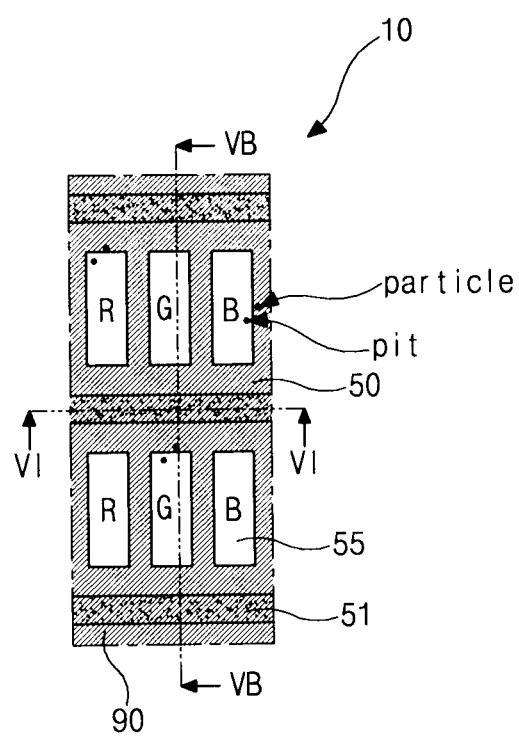
Figure 5A:
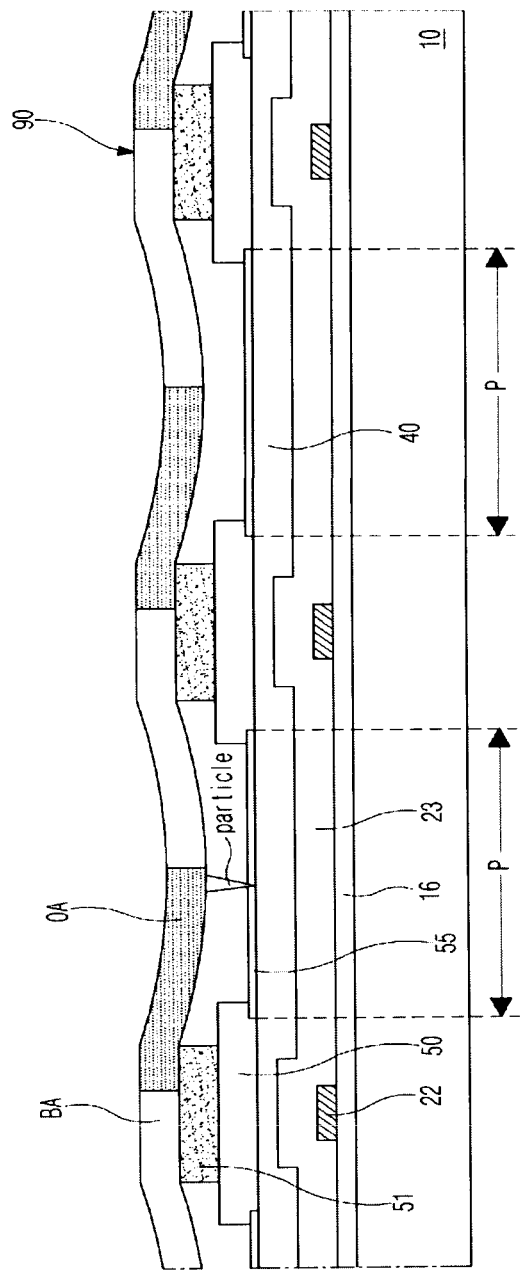
FIG. 5A is a cross-sectional view taken along the line VA-VA of FIG. 4A.
Figure 5B:
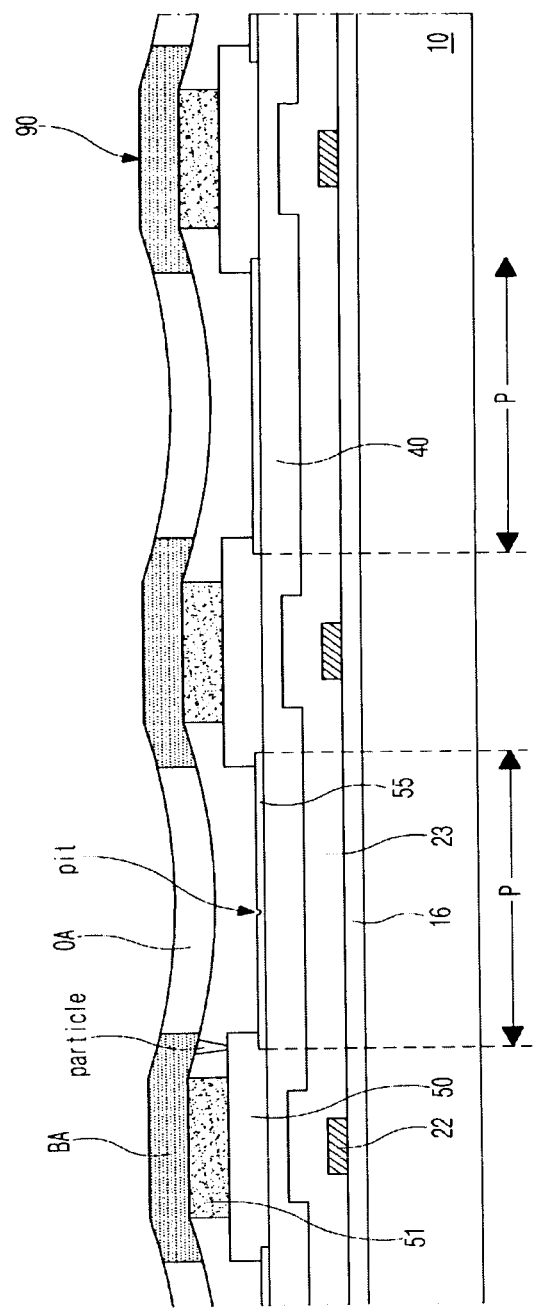
FIG. 5B is a cross-sectional view taken along the line VB-VB of FIG. 4B.
Figure 6:
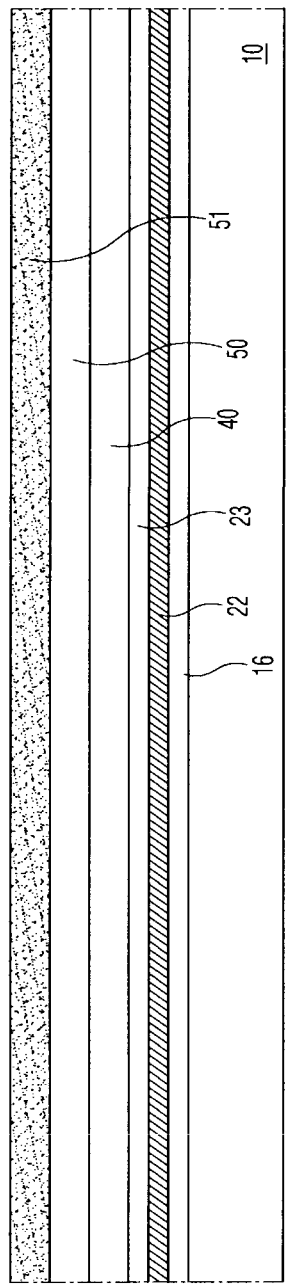
FIG. 6 is a cross-sectional view taken along the line IV-IV of FIG. 4B.
Figure 7:
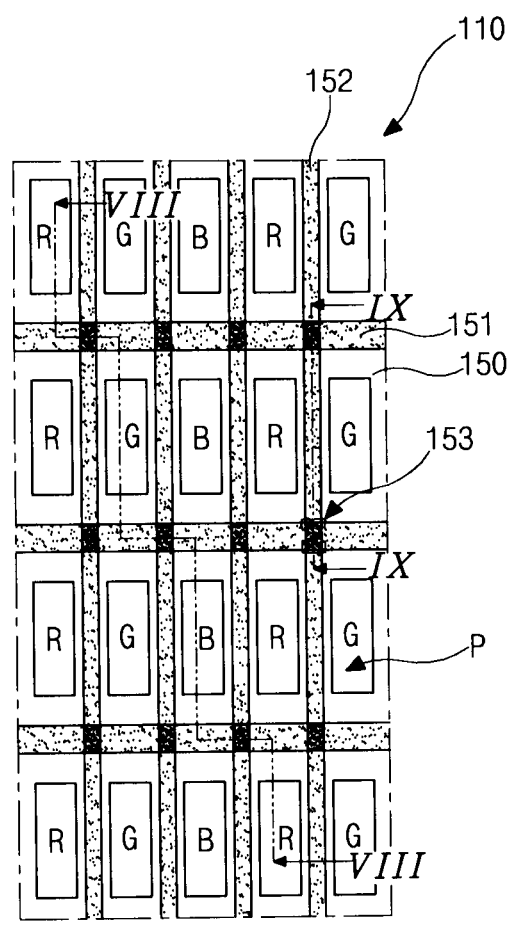
FIG. 7 is a plan view of schematically illustrating a top emission type organic electroluminescent display device according to an exemplary embodiment of the present invention.
Figure 8:
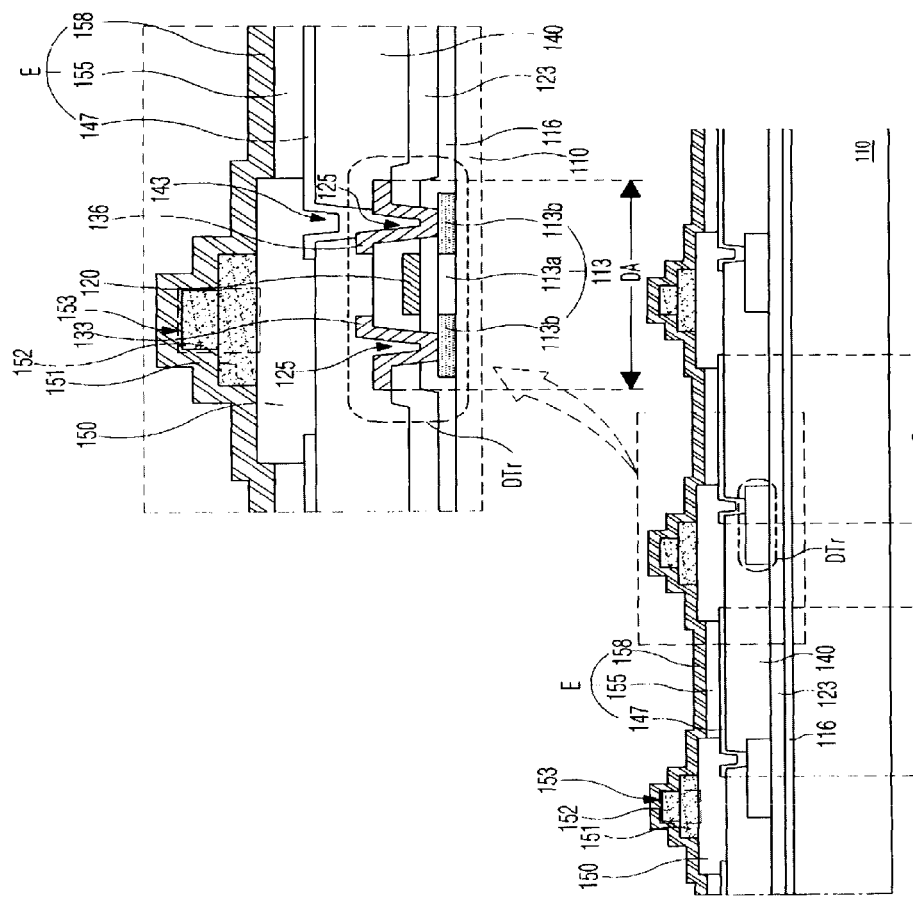
FIG. 8 is a cross-sectional view taken along the line VIII-VIII of FIG. 7.
Figure 9:
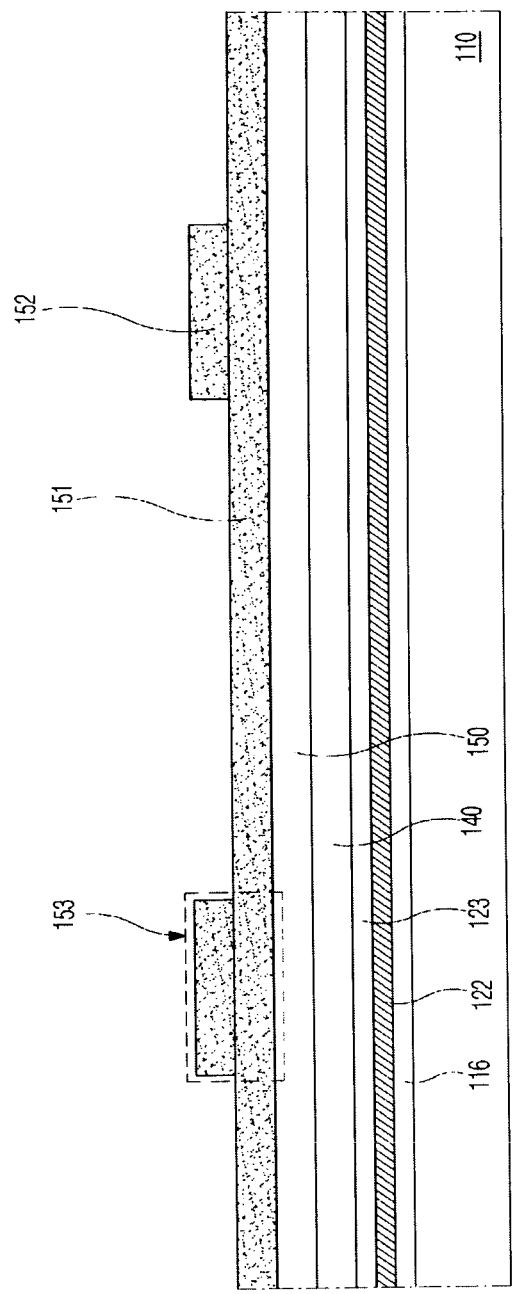
FIG. 9 is a cross-sectional view taken along the line IX-IX of FIG. 8.

FIG. 7 is a plan view of schematically illustrating a top emission type organic electroluminescent display device according to an exemplary embodiment of the present invention. FIG. 7 shows an organic electroluminescent diode, a buffer pattern and a spacer. FIG. 8 is a cross-sectional view taken along the line VIII-VIII of FIG. 7, and FIG. 9 is a cross-sectional view taken along the line IX-IX of FIG. 8. FIGS. 8 and 9 show a first substrate including a driving thin film transistor and the organic electroluminescent diode. For convenience of explanation, an area where a driving thin film transistor DTr is defined as a driving area, and although not shown in the figures, an area where a switching thin film transistor is defined as a switching area.

As shown in the figures, the top emission type organic electroluminescent display device 101 according to the present invention includes a first second substrate 110 and a second substrate (not shown), wherein a driving thin film transistor DTr, a switching thin film transistor (not shown) and an organic electroluminescent diode E are formed on the first substrate 110, and the second substrate is used for encapsulation.

More particularly, a gate line (not shown) and a data line (not shown) are formed to cross each other and define a pixel region P. The pixel region P includes the switching area and the driving area DA. The gate line extends along a first direction, and the data line extends along a second direction. A switching thin film transistor (not shown) is formed at a crossing portion of the gate and data lines. A driving thin film transistor DTr is formed at each pixel region P and connected to the switching thin film transistor and a power line (not shown), which is parallel to the data line.

A first electrode 147 is formed in each pixel region P and contacts a drain electrode 136 of the driving thin film transistor DTr. A buffer pattern 150 is formed in a border of each pixel region P, that is, between adjacent pixel regions P and contacts edges of the first electrode 147. An organic emission layer 155 is formed in each pixel region P and is surrounded by the buffer pattern 150. The organic emission layer 155 includes red, green and blue luminous patterns, which are sequentially and repeatedly disposed to correspond to the pixel region P, respectively.

A first spacer 151 having a dam shape is formed along a width direction of the pixel regions P, that is, the first direction, and disposed between the pixel regions P adjacent to each other along the second direction. A second spacer 152 having a dam shape is formed along a length direction of the pixel regions P, that is, the second direction, and disposed between the pixel regions P adjacent to each other along the first direction. The first spacer 151 is parallel to the gate line, and the second spacer 152 is parallel to the data line. The first and second spacers 151 and 152 surround each pixel region P. The first and second spacers 151 and 152 have a lattice shape in a display area similarly to the buffer pattern 150. The first spacer 151 has a first thickness, and a second spacer 152 has a second thickness. The first thickness may be the same as the second thickness. In addition, a third spacer 153 having a columnar shape is formed at a crossing portion of the first and second spacers 151 and 152. The third spacer 153 has a third thickness thicker than the first and second thicknesses. The second thickness may correspond to the sum of the first and second thicknesses of the first and second spacers 151 and 152 and may be twice as thick as the first or second thickness.

Like this, in the present invention, the first and second spacers 151 and 152 respectively having the first and second thicknesses are formed between adjacent pixel regions P, and the third spacer 153 having the third thickness is formed at the crossing portion of the first and second spacers 151 and 152. Accordingly, defects such as scratches or pits due to particles or protrusions are prevented or minimized while aligning a shadow mask (not shown) that is used for forming the organic emission layer 155.

Here, the first thickness and the second thickness may be within a range of 2.5 micrometers to 3 micrometers. There is no shadow problem that may be caused by increasing the first and second thicknesses of the first and second spacers 151 and 152 having the dam shape. In addition, the third spacer 153 has the third thickness thicker than the first and second thicknesses and has the columnar shape. The third thickness may be within a range of 5 micrometers to 6 micrometers. Accordingly, the shadow mask can be supported by the third spacer 153, and a distance between the first electrode 147 and the shadow mask may be within a range of 7.5 micrometers to 9 micrometers. Even though the shadow mask hangs down by 1 micrometer to 2 micrometers, at least a distance within a range of 5.5 micrometers to 9 micrometers can be maintained. Therefore, the defects such as scratches or pits due to the particles or protrusions, which have sizes of 1 micrometer to 6 micrometers, can be prevented.

Referring to FIG. 8, a semiconductor layer 113 is formed on the first substrate 110 of a transparent insulating material corresponding to the driving area DA and the switching area. The semiconductor layer 113 includes a first portion 113a of intrinsic polycrystalline silicon and second portions 113b of highly impurity-doped polycrystalline silicon. The second portions 113b are disposed at both sides of the first portion 113a. The first portion 113a functions as a channel of a thin film transistor. A buffer layer (not show) may be further formed between the first substrate 110 and the semiconductor layer 113. The buffer layer may be formed of an inorganic insulating material such as silicon oxide ($SiO_2$) or silicon nitride ($SiN_x$). The buffer layer may prevent the semiconductor layer 113 from being deteriorated due to alkali ions from the first substrate 110 when the semiconductor layer 113 is crystallized.

A gate insulating layer 116 is formed on a substantially entire surface of the first substrate 110 and covers the semiconductor layer 113. A gate electrode 120 is formed on the gate insulating layer 115 in each of the switching area and the driving area DA. The gate electrode 120 corresponds to the first portion 113a. The gate line (not shown) is formed on the gate insulating layer 116. The gate line extends along a first direction parallel to a width of the pixel region P and is connected to the gate electrode in the switching area.

An inter insulating layer 123 is formed on the gate electrode 120 and the gate line. The inter insulating layer 123 and the gate insulating layer 116 have semiconductor contact holes 125 exposing respective second portions 113b at both sides of the first portion 113a.

The data line (not shown) and the power line (not shown) are formed on the inter insulating layer 123 having the semiconductor contact holes 125. The data line extends along a second direction parallel to a length of the pixel region P and crosses the gate line. The power line is spaced apart from and parallel to the data line.

Source and drain electrodes 133 and 136 are formed on the inter insulating layer 123 in each of the switching area and the driving area DA. The source and drain electrodes 133 and 135 contact the second portions 113b through the semiconductor contact holes 125, respectively. The source and drain electrodes 133 and 136, the semiconductor layer 113 including the second portions 113b that contact the source and drain electrodes 133 and 136, the gate insulating layer 116 and the gate electrode 120 constitute the driving thin film transistor DTr. Although not shown in the figure, the switching thin film transistor having the same structure as the driving thin film transistor DTr is formed in the switching area. The switching thin film transistor is electrically connected to the driving thin film transistor DTr, the gate line and the data line. That is, the gate electrode of the switching thin film transistor is connected to the gate line, the source electrode of the switching thin film transistor is connected to the data line, and the drain electrode of the switching thin film transistor is connected to the gate electrode of the driving thin film transistor DTr.

The driving thin film transistor DTr and the switching thin film transistor may be p-type or n-type according to impurities doped into the second portions 113b of the semiconductor layer 113. In a p-type thin film transistor, an element in group 13 in the periodic table of International Union of Pure and Applied Chemistry (IUPAC) style, for example, boron (B) may be doped into the second portions 113b, and holes ma be used as carriers. In an n-type thin film transistor, an element in group 15 in the periodic table of IUPAC style, for example, phosphorus (P) may be doped into the second portions 113b, and electrons may be used as carriers. Therefore, the first electrode 147, which is connected to the drain electrode 136 of the driving thin film transistor DTr, may function as an anode electrode or a cathode electrode according to the type of the driving thin film transistor DTr. When the driving thin film transistor DTr is a p-type, the first electrode 147 functions as an anode electrode. When the driving thin film transistor DTr is an n-type, the first electrode 147 functions as a cathode electrode.

In the present invention, the driving thin film transistor DTr may be the p-type, and the first electrode 147, which is connected to the drain electrode 136 of the driving thin film transistor DTr may function as an anode electrode, for example. However, the driving thin film transistor DTr can be formed to be the n-type, and in this case the first electrode 147 can be formed to function as a cathode electrode.

A passivation layer 140 is formed on the driving thin film transistor DTr and the switching thin film transistor (not shown). The passivation layer 140 has a drain contact hole 143 exposing the drain electrode 136 of the driving thin film transistor DTr. The first electrode 147 is formed on the passivation layer 140 in each pixel region P and is connected to the drain electrode 143 of the driving thin film transistor DTr through the drain contact hole 143. The first electrode 147 may be formed of a transparent conductive material having relatively high work function, for example, indium tin oxide (ITO) or indium zinc oxide (IZO). Although not shown in the figure, to maximize a light-emitting efficiency in the top emission type, a reflection plate of a material having relatively high reflectance may be further formed under the first electrode 147 of a transparent conductive material having high work function. Alternatively, the first electrode 147 may have a double-layered structure that includes a lower layer of a metallic material having relatively high reflectance and an upper layer of the transparent conductive material. As stated above, the first electrode 147 functions as the anode electrode. When the first electrode 147 functions as the cathode electrode, the first electrode 147 may be formed of a metallic material having relatively low work function, for example, aluminum (Al), aluminum alloy, silver (Ag), magnesium (Mg) or gold (Au).

The buffer pattern 150 is formed on the first electrode 147, which has a single- or double-layered structure, in the border of each pixel region P, that is, between adjacent pixel regions P. The buffer pattern 150 surrounds each pixel region P and overlaps edges of the first electrode 147. The buffer pattern 150 has a lattice shape having openings in a display area including the pixel regions P.

The first spacer 151 and the second spacer 152 are formed on the buffer pattern 150 having the lattice shape surrounding each pixel region P in the display area. The first spacer 151 and the second spacer 152 have the dam shape and have a width narrower than that of the buffer 150 such that edges of the first spacer 151 and the second spacer 152 are disposed within edges of the buffer pattern 150. The first spacer 151 extends along the first direction and is parallel to the gate line (not shown), and the second spacer 152 extends along the second direction and is parallel to the data line (not shown). The first spacer 151 has the first thickness, and the second spacer 152 has the second thickness. The third spacer 153 having the columnar shape is formed at the crossing portion of the first and second spacers 151 and 152. The third spacer 153 has the third thickness thicker than the first or second thickness due to overlap of the first and second spacers 151 and 152. The first and second thicknesses may be within a range of 2.5 micrometers to 3 micrometers. The third thickness may be within a range of 5 micrometers to 6 micrometers.

The organic emission layer 155 is formed on the first electrode 147 in each pixel region surrounded by the buffer pattern 150. The organic emission layer 155 may be a single layer of an organic luminous material as shown in the figure. To increase the light-emitting efficiency, the organic emission layer 155 may include a hole injection layer, a hole transporting layer, an emitting material layer, an electrode transporting layer and an electron injection layer. Here, the hole injection and electron injection layers and the hole and electron transporting layers may have different positions depending on functions of the first and second electrodes 147 and 158. In the embodiment of the present invention, since the first electrode 147 functions as the anode electrode, the organic emission layer 155 may includes the hole injection layer, the hole transporting layer, the emitting material layer, the electron transporting layer and the electron injection layer in order.

The second electrode 158 is formed on the organic emission layer 155, the buffer pattern 150 and the first, second and third spacers 151, 152 and 153 all over the surface of the first substrate 110. The second electrode 158 may be formed of a metallic material having relatively low work function, for example, aluminum (Al), aluminum alloy, silver (Ag), magnesium (Mg) or gold (Au), such that the second electrode 158 functions as the cathode electrode.

On the other hand, when the second electrode 158 functions as the anode electrode, the second electrode 158 may be formed of a transparent conductive material having relatively high work function, for example, indium tin oxide (ITO) or indium zinc oxide (IZO).

The first electrode 147, the organic emission layer 155 and the second electrode 158 constitute an organic electroluminescent diode E.

Although not shown in the figure, the second substrate of a transparent material is disposed to face the first substrate 110 including the above-mentioned elements thereon. A seal pattern is formed between the first substrate 110 and the second substrate along their peripheries such that the substrates are attached. At this time, the first substrate 110 and the second substrate may have a uniform gap therebetween owing to the third spacer 153. In addition, a moisture absorbent may be disposed inside the seal pattern to remove moisture permeating into a space between the first substrate 110 and the second substrate.

A method of fabricating a top emission type organic electroluminescent display device according to the present invention will be explained hereinafter in more detail with reference to accompanying drawings.

FIGS. 10A to 10G are cross-sectional views of illustrating a substrate for a top emission type organic electroluminescent display device in processes of fabricating the same according to the present invention. FIGS. 10A to 10G correspond to the line VIII-VIII of FIG. 7. FIGS. 11A and 11B are plan views of illustrating the substrate for a top emission type organic electroluminescent display device in a process of forming an organic emission layer using a shadow mask according the present invention.

Figure 10A:
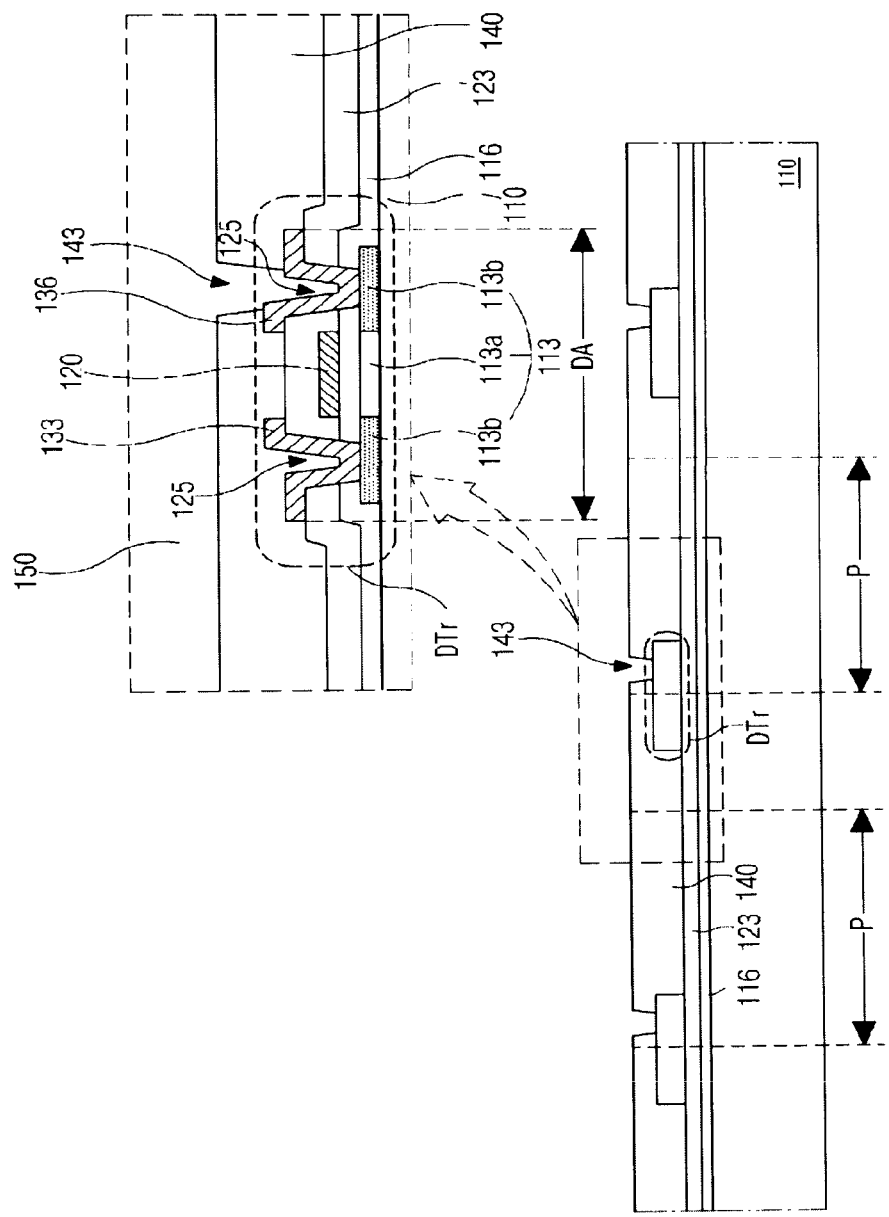
FIGS. 10A to 10G are cross-sectional views of illustrating a substrate for a top emission type organic electroluminescent display device in processes of fabricating the same according to the present invention.
Figure 11A:
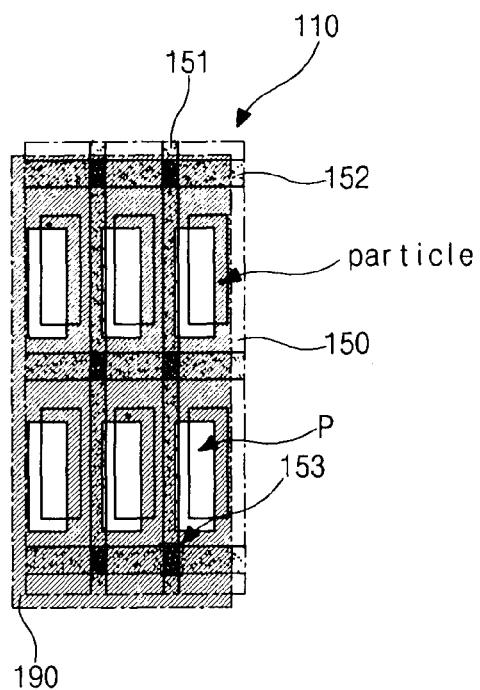
FIGS. 11A and 11B are plan views of illustrating the substrate for a top emission type organic electroluminescent display device in a process of forming an organic emission layer using a shadow mask according the present invention.
Figure 11B:
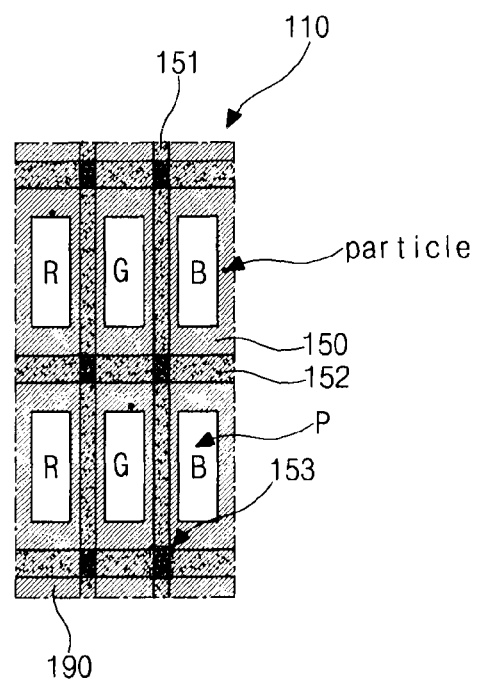

In FIG. 10A, an intrinsic amorphous silicon layer (not shown) is formed on an insulating substrate 110 by depositing intrinsic amorphous silicon. The intrinsic amorphous silicon layer is crystallized by irradiating a laser beam or performing thermal treatment to thereby form a polycrystalline silicon layer (not shown). The polycrystalline silicon layer is patterned through a mask process including steps of applying photoresist, exposing the photoresist to light using a mask, developing the light-exposed photoresist, etching and stripping, and a semiconductor layer 113 of intrinsic polycrystalline silicon is formed in each of a switching area (not shown) and a driving area DA. Here, a first buffer layer (not shown) may be further formed on a substantially entire surface of the substrate 110 by depositing an inorganic insulating material, for example, silicon oxide ($SiO_2$) or silicon nitride ($SiN_X$), before forming the intrinsic amorphous silicon layer.

A gate insulating layer 116 is formed on the semiconductor layer 113 of the polycrystalline silicon by depositing an inorganic insulating material, for example, silicon oxide ($SiO_2$) or silicon nitride ($SiN_X$). A first metal layer (not shown) is formed on the gate insulating layer 116 by depositing a metallic material, for example, aluminum (Al), aluminum alloy such as aluminum nitride (AlNd), copper (Cu), copper alloy or chromium (Cr). The first metal layer is patterned through a mask process, and a gate electrode 120 is formed to correspond to a central portion of the semiconductor layer 113. A gate line (not shown) is also formed along a first direction and is connected to a gate electrode (not shown) in the switching area.

Next, impurities are doped into the substrate 110 including the semiconductor layer 113 thereon by using the gate electrode 120 as a blocking mask to thereby form a first portion 113a and second portions 113b of the semiconductor layer 113. The first portion 113a corresponds to the gate electrode 120 and excludes the impurities, and the second portions 113a are disposed at both sides of the first portion 113a and doped with the impurities. The impurities may be an element in group 13 or an element in group 15 in the periodic table of IUPAC style.

An inter insulating layer 123 is formed on a substantially entire surface of the substrate 110 including the first and second portions 113a and 113b of the semiconductor layer 113 by depositing an inorganic insulating material such as silicon oxide ($SiO_2$) or silicon nitride ($SiN_X$). The inter insulating layer 123 and the gate insulating layer 116 are patterned together or simultaneously through a mask process to thereby form semiconductor contact holes 125 exposing respective second portions 113b of the semiconductor layer 113.

A second metal layer (not shown) is formed on the inter insulating layer 123 by depositing a metallic material, for example, one of aluminum (Al), aluminum alloy such as aluminum alloy (AlNd), copper (Cu), copper alloy, chromium (Cr) and molybdenum (Mo). The second metal layer is patterned through a mask process, and source and drain electrodes 133 and 136 are formed. The source and drain electrodes 133 and 136 are spaced apart from each other and are connected to the second portions 113b through the semiconductor contact holes 125.

At the same time, a data line (not shown) and a power line (not shown) are formed on the inter insulating layer 123. The data line is connected to the source electrode (not shown) in the switching area. The data line extends along a second direction and crosses the gate line. The power line is spaced apart from and parallel to the data line.

The semiconductor layer 113, the gate insulating layer 116, the gate electrode 120, the inter insulating layer 123 and the source and drain electrodes 133 and 136 constitute the driving thin film transistor DTr. The switching thin film transistor (not shown) having the same structure as the driving thin film transistor DTr is formed in the switching area.

A passivation layer 140 is formed on the source and drain electrodes 133 and 136 by depositing an inorganic insulating material such as silicon oxide ($SiO_2$) or silicon nitride ($SiN_x$) or applying an organic insulating material such as photo acryl or benzocyclobutene (BCB). The passivation layer 140 is patterned through a mask process to thereby form a drain contact hole 143 exposing the drain electrode 136 of the driving thin film transistor DTr.

Figure 10B:
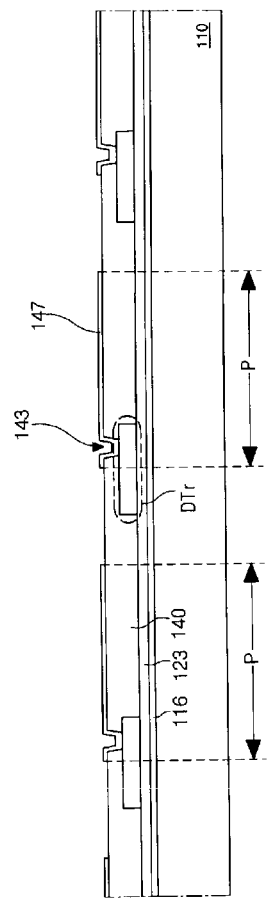

In FIG. 10B, a first electrode 147 is formed on the passivation layer 140 by depositing a transparent conductive material having relatively high work function, for example, indium tin oxide (ITO) or indium zinc oxide (IZO) and patterning the transparent conductive material. The first electrode 147 is connected to the drain electrode 136 of the driving thin film transistor DTr through the drain contact hole 143. The first electrode 147 has a single-layered structure.

In the meantime, the first electrode 147 can be formed to have a double-layered structure. In this case, aluminum (Al) or aluminum alloy such as aluminum nitride (AlNd) having relatively high reflectance may be deposited on the passivation layer 140, and a transparent conductive material having relatively high work function, for example, indium tin oxide (ITO) or indium zinc oxide (IZO) may be deposited, thereby forming double layers (not shown). The double layers may be patterned through a mask process, and the first electrode 147 may have a double-layered structure.

Meanwhile, when the first electrode 147 functions as a cathode electrode, the first electrode 147 may be formed of a metallic material having relatively low work function, for example, aluminum (Al), aluminum alloy, silver (Ag), magnesium (Mg), gold (Au) and may have a single-layered structure.

Figure 10C:
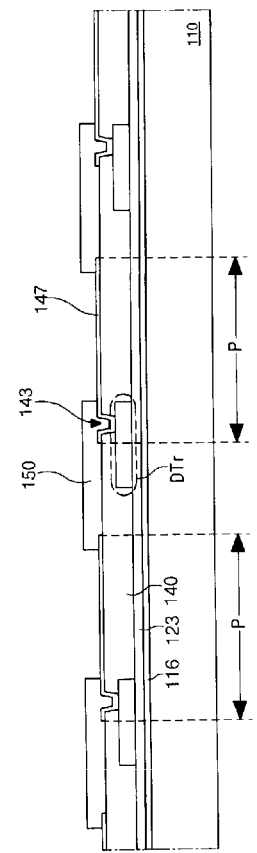

In FIG. 10C, a buffer pattern 150 is formed on the first electrode 147 by applying an organic insulating material or depositing an inorganic insulating material and then patterning it. The buffer pattern 150 surrounds each pixel region P. The organic insulating material may be photo acryl or benzocyclobutene (BCB), and the inorganic insulating material may be silicon oxide ($SiO_2$) or silicon nitride ($SiN_x$).

Figure 10D:
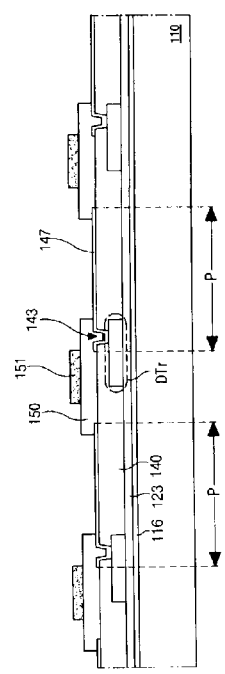

In FIG. 10D, a first spacer layer (not shown) is formed on the substrate 110 including the buffer pattern 150 by applying a photosensitive organic insulating material all over the surface using a spin coating apparatus. The first spacer layer may have a first thickness within a range of 2.5 micrometers to 3 micrometers. The first spacer layer is patterned through a mask process, and a first spacer 151 is formed on the buffer pattern 150 along the first direction and disposed in a border of each pixel region P. The first spacer 151 has a dam shape. The photosensitive organic insulating material may be polyimide, photo acryl or benzocyclobutene (BCB).

Figure 10E:
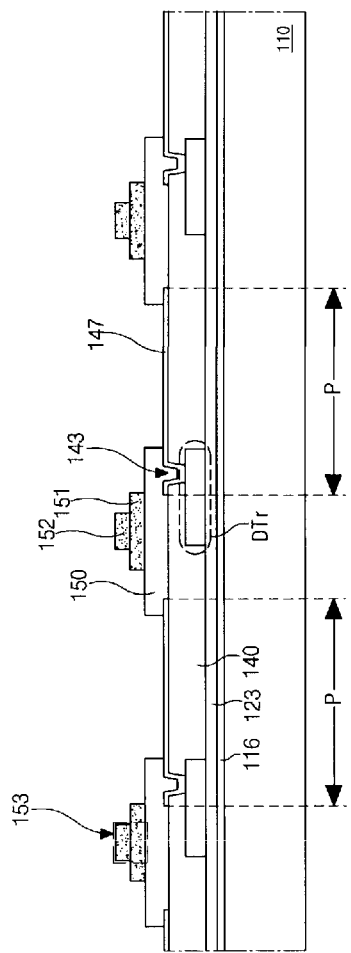

In FIG. 10E, a second spacer layer (not shown) is formed on the substrate 110 including the first spacer 151 by applying a photosensitive organic insulating material all over the surface. The second spacer layer may have a second thickness within a range of 2.5 micrometers to 3 micrometers. The photosensitive organic insulating material may be polyimide, photo acryl or benzocyclobutene (BCB). The second spacer layer may be formed of the same material as or a different material from the first spacer layer. The second spacer layer may have the same photosensitive property as the first spacer layer.

For example, when the first spacer layer is formed of negative-type polyimide and the second spacer layer is be formed of photo acryl or benzocyclobutene, there is no problem because the second spacer layer is patterned by a developer different from polyimide.

In the meantime, when the first spacer layer and the second spacer layer are formed of polyimide, it is desirable that the polyimide is a negative-type, in which a portion exposed to light remains after a developing step. More particularly, when the first spacer layer is formed of negative-type polyimide, a portion exposed to light becomes the first spacer 151 after a developing step. Next, the second spacer layer of negative-type polyimide is formed on the first spacer 151. The second spacer layer is selectively exposed to light and then is developed. Then, a portion of the second spacer layer, which is not exposed to light, is removed, and a second spacer 152, which is exposed to light, is formed. At this time, since the first spacer 151 is already exposed to light, the first spacer 151 does not react with the developer for the second spacer 152. Therefore, there is no problem that the first spacer 151 is removed when the second spacer 152 is formed. When the first and second spacers 151 and 152 are formed of different materials, different developers are used, and there is no problem.

The second spacer 152 is formed along the second direction and disposed in a border of each pixel region P. The second spacer 152 has a dam shape. Here, the second spacer 152 may have a narrower width than the first spacer 151.

In addition, the first and second spacers 151 and 152 overlap each other at a crossing portion of the first and second spacers 151 and 152 to thereby form a third spacer 153. The third spacer 153 has a third thickness with a range of 5 micrometers to 6 micrometers and has a columnar shape.

Figure 10F:
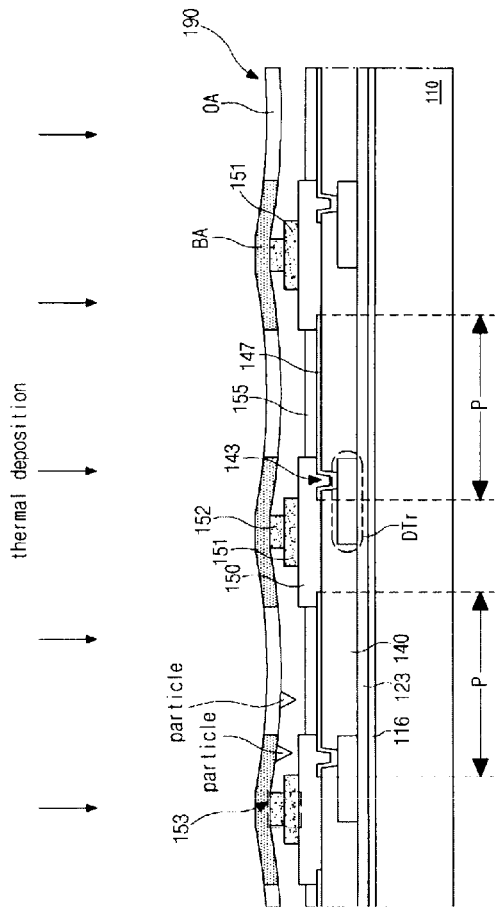

In FIG. 10F, FIG. 11A and FIG. 11B, a shadow mask 190 is disposed over the substrate 110 including the second and third spacers 152 and 153 thereon. The shadow mask 190 has openings OA corresponding to the pixel regions P and blocking portions BA corresponding to other regions excluding the pixel regions P. The shadow mask 190 is disposed close by the substrate 110.

Next, the shadow mask 190 is aligned with the substrate 110 such that the openings OA of the shadow mask 190 are disposed right over central portions of the pixel regions P.

At this time, even though particles or protrusions are formed at a lower surface of the blocking portion BA of the shadow mask 190 and are disposed over the first electrode 147 in the pixel region P, the shadow mask 190 is supported by the third spacer 153 having the third thickness of 5 micrometers to 6 micrometers, and thus the particles or protrusions having a size of 1 micrometer to 6 micrometers do not contact the first electrode 147. Accordingly, scratch or pit is not formed on the first electrode 147, and there is no dark point when an organic emission layer is formed on the first electrode 147.

Next, an organic emission layer 155 is formed on the first electrode 147 by thermally depositing an organic luminous material through the openings OA of the shadow mask 190. The organic emission layer 155 may have a single-layered structure as shown in the figure. Alternatively, the organic emission layer 155 may have a multiple-layered structure by sequentially forming a hole injection layer, a hole transporting layer, an emitting material layer, an electrode transporting layer and an electron injection layer.

Figure 10G:
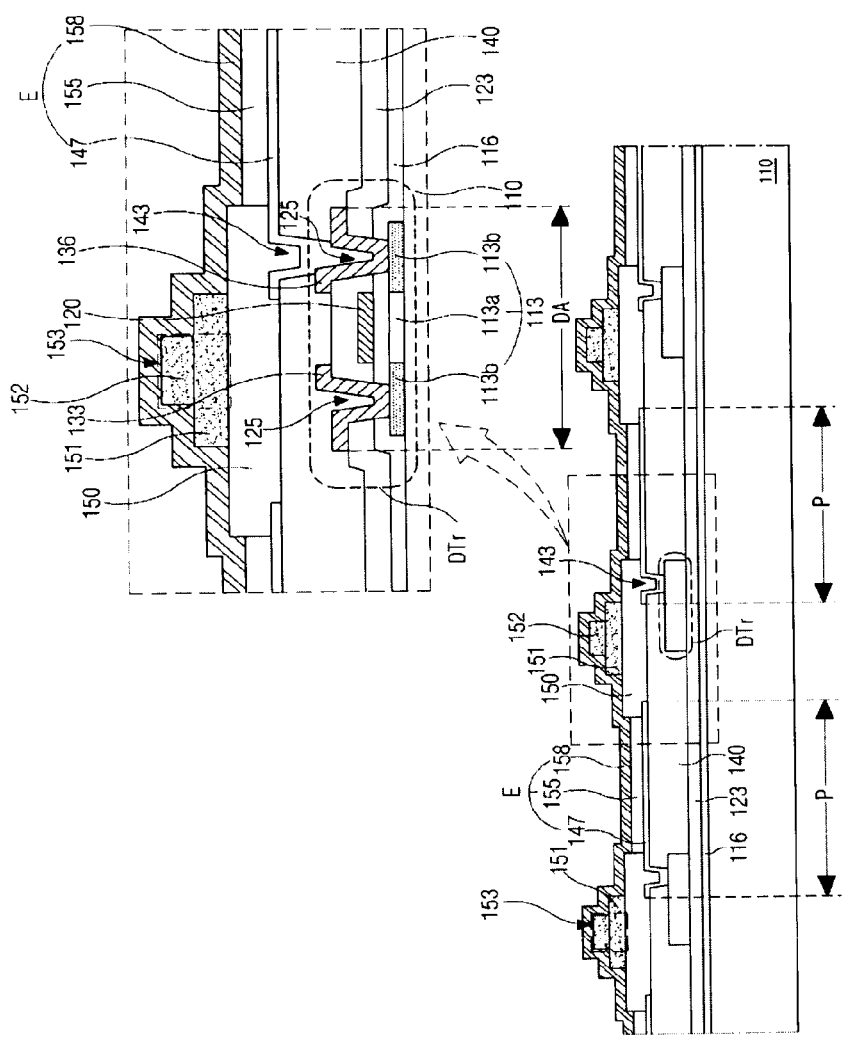

In FIG. 10G, a second electrode 158 is formed on the organic emission layer 155 all over the surface of the substrate 110 by thermally depositing a metallic material having relatively low work function, for example, one of aluminum (Al), aluminum alloy, silver (Ag), magnesium (Mg) and gold (Au). The second electrode 158 has a relatively thin thickness of 5 Å to 50 Å such that light from the organic emission layer 155 is transmitted through the second electrode 158. Accordingly, the substrate for an organic electroluminescent display device is completed.

Meanwhile, when the second electrode 158 functions as an anode electrode, the second electrode may be formed of a transparent conductive material having relatively high work function, for example, indium tin oxide (ITO) or indium zinc oxide (IZO).

Then, a transparent substrate is disposed to face the substrate 110 including the above-mentioned elements thereon. A seal pattern is formed between the substrate 110 and the transparent substrate along their peripheries. In addition, a moisture-absorbing pattern of barium oxide or calcium oxide may be disposed inside the seal pattern between the substrate 110 and the transparent substrate.

Next, the substrate 110 and the transparent substrate are attached under inert gas or vacuum to complete the top emission type organic electroluminescent display device according to the present invention.

In the top emission type organic electroluminescent display device according to the present invention, the problems such as scratches or pits are prevented when the organic emission layer is formed using the shadow mask, and display qualities are increased. Furthermore, productivity is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A top emission type organic electroluminescent display device, comprising:
    a first substrate including a pixel region;
    a switching thin film transistor and a driving thin film transistor in the pixel region on the first substrate;
    a passivation layer covering the switching thin film transistor and the driving thin film transistor and exposing a drain electrode of the driving thin film transistor;
    a first electrode on the passivation layer and connected to the drain electrode of the driving thin film transistor;
    a buffer pattern in a border of the pixel region and overlapping an edge of the first electrode;
    a first spacer on the buffer pattern along a first direction, the first spacer having a first thickness and a dam shape;
    a second spacer on the buffer pattern along a second direction, the second spacer having a second thickness and a dam shape;
    a third spacer on the buffer pattern at a crossing portion of the first and second spacers, the third spacer having a third thickness and a columnar shape, wherein the third thickness is thicker than the first thickness or the second thickness;
    an organic emission layer on the first electrode between adjacent buffer patterns;
    a second electrode on the organic emission layer and the first, second and third spacers;
    a second substrate facing the first substrate; and
    a seal pattern between peripheries of the first and second substrates.

2. The display device according to claim 1, wherein the first and second thicknesses are within a range of 2.5 micrometers to 3 micrometers, and the third thicknesses are within a range of 5 micrometers to 6 micrometers.

3. The display device according to claim 1, wherein the first thickness equals to the second thickness.

4. The display device according to claim 1, wherein a width of the first spacer is narrower than the buffer pattern and wider than the second spacer.

5. The display device according to claim 1, further comprising:
    gate and data lines connected to the switching thin film transistor and crossing each other; and
    a power line parallel to the data line and connected to the driving thin film transistor.

6. The display device according to claim 1, wherein the organic emission layer includes a hole injection layer, a hole transporting layer, an emitting material layer, an electrode transporting layer and an electron injection layer.

7. The display device according to claim 1, wherein the first, second and third spacers are formed of an organic insulating material.

8. The display device according to claim 7, wherein the first, second and third spacers are formed of a negative-type photosensitive material.

* * * * *